(12) United States Patent
Pachchigar

(10) Patent No.: US 10,419,014 B2
(45) Date of Patent: Sep. 17, 2019

(54) DIFFERENTIAL OUTPUT PGIA ARCHITECTURE

(71) Applicant: Analog Devices, Inc., Norwood, MA (US)

(72) Inventor: Maithil M. Pachchigar, Winchester, MA (US)

(73) Assignee: Analog Devices, Inc., Norwood, MA (US)

(*) Notice: Subject to any disclaimer, the term of this patent is extended or adjusted under 35 U.S.C. 154(b) by 0 days.

(21) Appl. No.: 15/890,127

(22) Filed: Feb. 6, 2018

(65) Prior Publication Data

US 2019/0245552 A1 Aug. 8, 2019

(51) Int. Cl.
*H03M 1/18* (2006.01)
*H03M 1/12* (2006.01)

(52) U.S. Cl.
CPC ......... *H03M 1/188* (2013.01); *H03M 1/1205* (2013.01); *H03M 1/183* (2013.01)

(58) Field of Classification Search
CPC ........ H03M 1/18; H03M 1/183; H03M 1/188; H03M 1/1205
USPC .................................................. 341/139, 155
See application file for complete search history.

(56) References Cited

U.S. PATENT DOCUMENTS

| | | | |
|---|---|---|---|
| 5,233,309 A * | 8/1993 | Spitalny | H03G 3/001 330/144 |
| 6,563,381 B1 * | 5/2003 | Strong | H03F 3/45282 327/312 |
| 7,202,805 B2 * | 4/2007 | Sherry | H03F 1/34 341/120 |
| 7,327,189 B2 | 2/2008 | Regier | |
| 7,643,573 B2 * | 1/2010 | Kejariwal | H03F 3/45188 330/278 |
| 8,138,830 B2 * | 3/2012 | Bugyik | H03F 3/45475 330/301 |
| 9,065,400 B2 * | 6/2015 | Larson | H03F 3/45475 |

* cited by examiner

*Primary Examiner* — Khai M Nguyen
(74) *Attorney, Agent, or Firm* — Schwegman Lundberg & Woessner, P.A.

(57) ABSTRACT

The present disclosure provides a simplified, multiple-gain, front-end circuit for analog-to-digital converter systems. In an example, a front-end circuit for an analog-to-digital converter (ADC) can include first and second input amplifiers configured to receive an input signal, and a gain selection circuit coupled to the first input amplifier and the second input amplifier; the gain selection circuit comprising a plurality resistor strings, each resistor string including a plurality of resistors coupled in series, and wherein each string includes a first end node coupled to an output of the first input amplifier and a second end node coupled to an output of the second input amplifier.

20 Claims, 3 Drawing Sheets

DIFFERENTIAL OUTPUT PGIA ARCHITECTURE

TECHNICAL FIELD OF THE DISCLOSURE

Methods and apparatus for an analog-to-digital converter system are provided, and, more particularly, for a programmable gain input amplifier (PGIA) architecture for driving an ADC system.

BACKGROUND

Analog-to-digital converters (ADCs) have allowed digital collection of analog data. ADCs can often employ an amplifier to assist in scaling an input signal to the sensing range of the ADC. Although the amplifiers allow for the signal to be scaled to the full range of the ADC, the amplifiers can distort or can assist in distorting the collected data. Desirable characteristics of the amplifier can include high input impedance, variable scaling, high common-mode signal rejection, and conversion from, for example, single ended reception to differential output or other forms of signal classification including single-ended, differential, unipolar, bipolar or combinations thereof. Designers often tradeoff one desirable characteristic for another one because of physical board limitations, circuit complexity, financial limitations, power limitations, or combinations thereof. Conventional front-end circuits for a high-resolution ADC system often include a single-ended to differential driver, or a pair of operational amplifiers to drive a fully differential output amplifier of the front-end circuit. Such systems can have issues with linearity, drift and speed.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
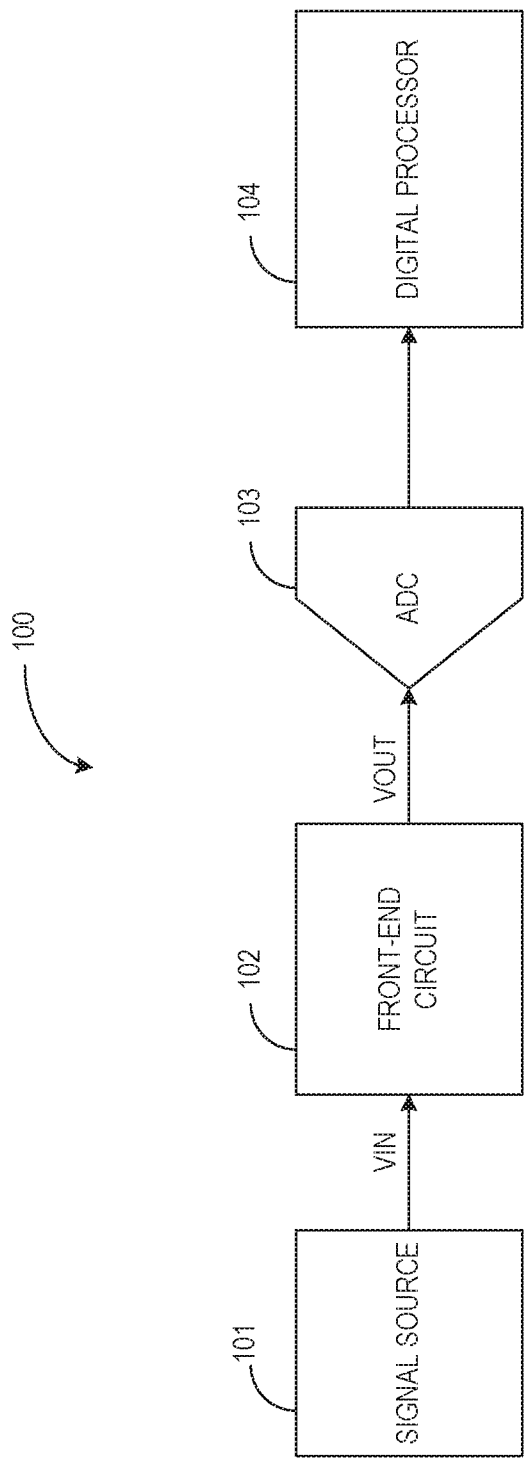
FIG. 1 illustrates generally an example analog-to-digital converter (ADC) system.

As the digital age has evolved, data acquisition, digital conversion and computer analysis of the collected data has become commonplace. A common architecture for collecting analog data can include an analog-to-digital converter (ADC). Such an architecture can often include an input amplifier to receive the raw signal and amplify or attenuate the signal to scale the range of the signal with the range of the ADC. However The present inventor has recognized new techniques for FIG. 1 illustrates generally an example analog-to-digital converter (ADC) system 100. The system 100 can include a signal source 101, a front-end circuit 102, an ADC 103, and a digital processor 104. In certain examples, the signal source 101 can be a sensor or some other electronic device that provides an analog output signal. The digital processor 104 can receive a digital representation of the analog output signal of the sensor 101 and can process the digital representation to accomplish a certain task, such as displaying the sensor data, controlling an operation associated with the sensor 101, or combinations thereof. The ADC 103 can provide the digital representation of the analog input signal to the digital processor 104. In certain examples, the ADC 103 can be a high-resolution ADC which, for purposes of this application can be an ADC having 18 or more bits of resolution and can include, but is not limited to, successive-approximation-register (SAR) ADCs or sigma-delta ADCs. Often, the range of the output of the signal source 101 and the range of the input of the ADC 103 do not match very closely. Also, whether the ranges match or not, direct connection of the ADC 103 to the signal source 101 can often distort the signal provided from the signal source 101.

The front-end circuit 102 is designed to receive the signal provided by the signal source 101 without significantly affecting the relative nature of the signal. In certain examples, the front-end circuit 102 can amplify or attenuate the signal to match the sensing range of the ADC 103. In some examples, the front-end circuit 102 can convert the signal to a different format, such as from a single-ended signal to a differential signal or a differential signal to a differential signal for input to a high-resolution ADC 103.

Figure 2:
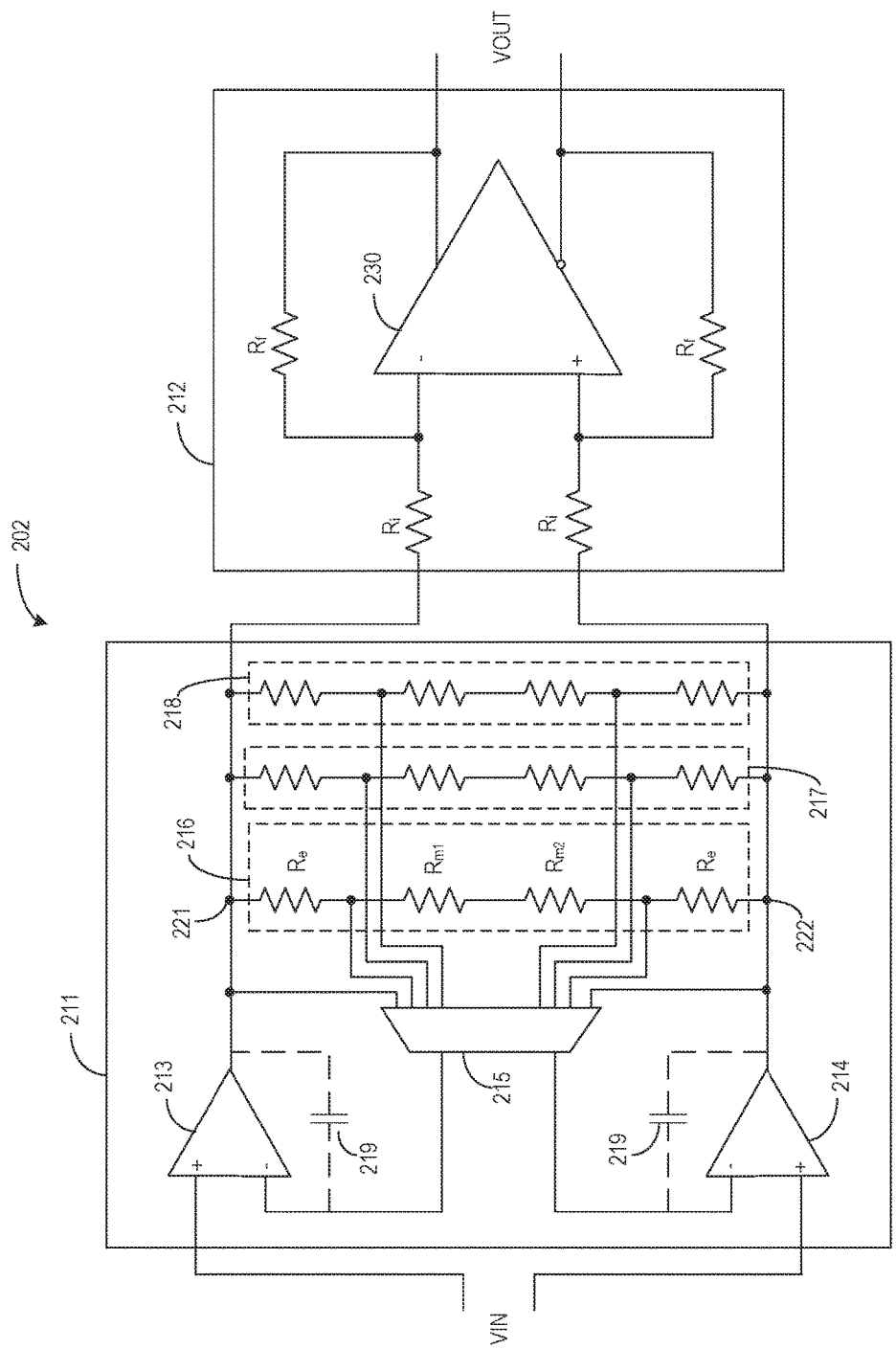
FIG. 2 illustrates an example front-end circuit according to the present subject matter.

FIG. 2 illustrates an example front-end circuit 202 according to the present subject matter. The front-end circuit 202 can include a first stage 211 and a second stage 212. The first stage 211 is configured to provide a high impedance input such that the input analog signal (VIN) is not affected by connection to an ADC. In certain example, the first stage 211 can also scale the input analog signal (VIN) such that the output signal (VOUT) of the front-end circuit 202 matches a sensing range of the ADC. The second stage 212 can receive the output of the first stage 211 and can provide a fully differential signal (VOUT) to the input of the ADC.

In certain examples, the first stage 211 can include a pair of input amplifiers 213, 214, a selection circuit 215, and one or more resistor strings 216, 217, 218. In certain examples, the selection circuit 215 can include a multiplexer, such as a dual multiplexer that allows for two sets of inputs and provides two outputs, one output from each set of inputs. A pair of input amplifiers 213, 214 can be junction gate field-effect transistor (JFET) type, which can provide instrumentation amplifier characteristics of high input impedance and high common mode rejection ratios (CMRRs). The combination of the amplifiers 213, 214, selection circuit 215 and the resistor strings 216, 217, 218 can allow the first stage 211 to amplify, attenuate or buffer the input analog signal (VIN) such that a linearly modified representation of the input analog signal is provided at the output of the first stage 211. The input analog signal (VIN) can be either a differential signal or a single ended signal. A first portion of the input analog signal (VIN) can be applied to a first input of the first input amplifier 213, and a second portion of the input analog signal (VIN) can be applied to a first input of the second input amplifier 214.

The selection circuit 215 can complete a feedback circuit of each of the first input amplifier 213 and the second input amplifier 214. The feedback circuit for each of the input amplifiers 213, 214 can selectively include one of the one or more resistor strings 216, 217, 218. Each resistor string 216, 217, 218 can include multiple resistances or resistors coupled in series. In some examples, each resistor string can have at least three resistances. In certain examples, the resistor strings can include four resistors which allows for designers to use off-the shelf components that can include precision matched resistors. Some resistances may be represented by multiple resistors. In certain examples, one of the selections for completing the feedback circuit for each of the input amplifiers 213, 214 can have the selection circuit 215 bypass the resistor strings and can couple the output of each input amplifier 213, 214 directly to an input of the corresponding input amplifier 213, 214. In certain examples, the input of the input amplifier 213, 214 receiving the output of the selection circuit 215 is the inverting input of the corresponding input amplifier 213, 214. When the output of each input amplifier 213, 214 is directly coupled to the inverting input of the corresponding input amplifier 213, 214, the input amplifier 213, 214 provides unity gain. In certain examples, the non-inverting input of each of the input amplifiers 213, 214 can receive the signal from the signal source (e.g., FIG. 1, 101).

In certain examples, the first stage 211 can include multiple resistor strings 216, 217, 218 coupled in parallel such that a first end node 221 of each resistor string 216, 217, 218 is coupled to the output of the first input amplifier 213 and the second end node 222 of each resistor string 216, 217, 218 is coupled to the output of the second input amplifier 214. Each resistor string 216, 217, 218 can include two intermediate nodes. An intermediate node is separated from one of the end nodes 221, 222 by an end resistor ($R_e$), from the other end node by at least two other resistors, and from the other intermediate node by at least one middle resistor ($R_m$). Some examples, can include two middle resistors ($R_{m1}$, $R_{m2}$). Each of the two intermediate nodes of a resistor string can be coupled to an input of the selection circuit 215. Upon selection of a resistor string to complete the feedback circuit of the input amplifiers, the intermediate nodes can be coupled to an input to a corresponding one of the first and second input amplifiers 213, 214 such that a first end resistor ($R_e$) couples the output of the first input amplifier 213 to an inverting input of the first input amplifier 213, and a second end resistor ($R_e$) couples the output of the second input amplifier 214 to an inverting input of the second input amplifier 214. In such a configuration, the gain ($G_i$) for first stage 211 can be $$G_i = 1 + \frac{\Omega_e}{\Omega_m}, \quad \text{Eq. 1}$$

where $\Omega_e$ is the resistance of the corresponding end resistor ($R_e$), and $\Omega_m$ is the resistance of the sum of one or more middle resistors ($R_{m1}$, $R_{m2}$). The two middle resistors can be identical in value (e.g., $\Omega_{m1}=\Omega_{m2}$)

In certain examples, each resistor string 216, 217, 218 can be fabricated as an integrated circuit. As such, the resistors can be precisely matched such that the resistance of each resistor is within 0.01%, and other characteristics such a thermal coefficients are also nearly identical. In addition, the resistors can be very space efficient compared to conventional architectures. Using such matched resistors can provide better linearity over conventional architectures. Having multiple resistor strings 216, 217, 218 can allow for multiple selectable gains for the first stage 211. In certain examples, optional capacitors 219 can be coupled between the inverting input and the output of each input amplifier 213, 214 to assist stability of the front-end circuit 202.

The second stage 212 can include a differential amplifier 230. The second stage 212 can receive the output of the first stage 211 and can provide a representation of the input signal (VIN) at the output. For example, a first differential input, such as the inverting input, of the second stage 212 can be coupled to the output of the first input amplifier 213 of the first stage 211, and a second differential input, such as the non-inverting input, of the second stage 212 can be coupled to the output of the second input amplifier 214 of the first stage 211. In certain examples, the second stage 212 can amplify or attenuate the signal received form the first stage 211. For example, each differential input of the second stage 212 can include an input resistor ($R_i$) and each input of the differential amplifier 230 of the second stage 212 can be coupled to a corresponding differential output of the differential amplifier 230 by a feedback resistor ($R_f$). The ratio of each input resistor ($R_i$) to the corresponding feedback resistor ($R_f$) can determine the gain of the differential amplifier 230 of the second stage 212. For example, the gain of the differential amplifier 230 can be given by, $$G_d = \frac{\Omega_f}{\Omega_i}, \quad \text{Eq. 2}$$

where $\Omega_f$ is the resistance of the feedback resistors ($R_f$) and $\Omega_i$ is the resistance of the corresponding input resistors ($R_i$).

In certain examples, the feedback and input resistors ($R_f$, $R_i$) are matched resistors that have very little difference in corresponding resistance values, as well as, other characteristics including, but not limited to, temperature coefficients. Such matching can allow the example architecture to achieve a common mode rejection ratio on the order of 90 dB. In certain examples, the front-end circuit, when coupled with an ADC (e.g., FIG. 1, 103) can provide integral nonlinearity error (INL) on the order of +/−2.5 parts per million (ppm), signal-to-noise ratio (SNR) on the order of −125 dB, and gain error and offset error drift of about +/−6 ppm/° C. over a temperature range of 0° C. to 70° C. In certain examples, a higher order anti-aliasing active filtering can be implemented in the second stage 212 to remove the out-of-band noise by using additional passive components (e.g., R and C) for the bandwidth of interest. In certain examples, the over-ranging can be implemented in the second stage 212 by using a resistor in parallel with a feedback resistor ($R_f$) for a calibration purpose.

Figure 3:
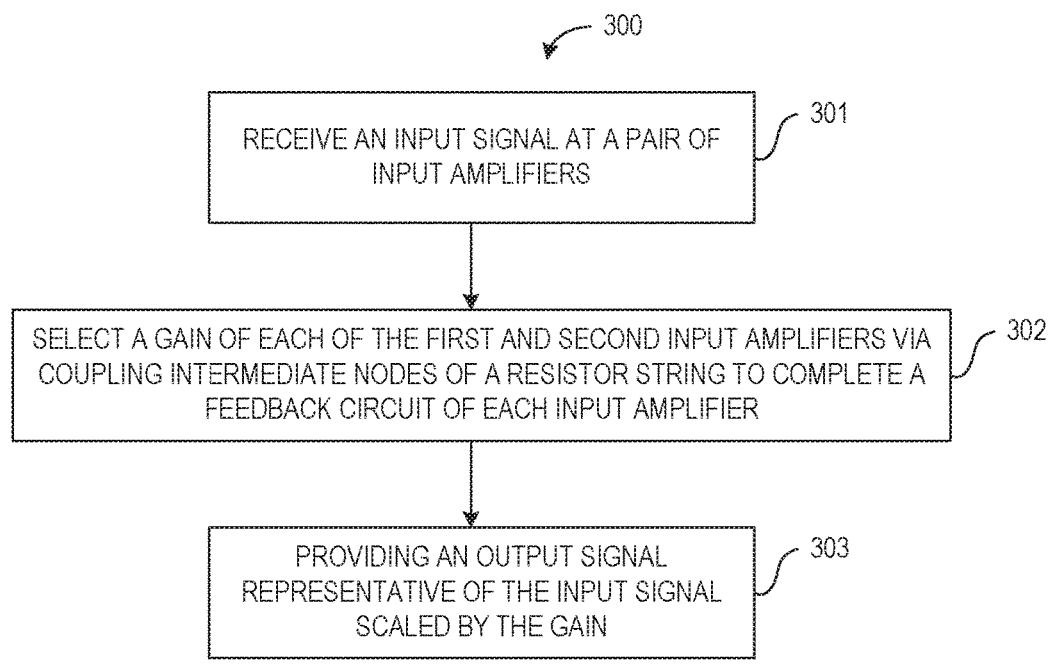
FIG. 3 illustrates generally a flowchart of an example method for operating a front-end circuit of an analog-to-digital converter.

FIG. 3 illustrates generally a flowchart of an example method 300 for operating a front-end circuit of an analog-to-digital converter. At 301, the front-end circuit can receive an input signal at two input amplifiers. At 302, gains of the input amplifiers can be set using a first selection state. During the first selection state, intermediate nodes of a selected resistor string can be coupled to an input of each of the input amplifiers. End nodes of the selected resistor string can be coupled to the output of the input amplifiers. Such an arrangement can couple a first resistor or resistance (e.g., $\Omega_e$) between the inverting input of the first input amplifier and the output of the first input amplifier, a second resistor or resistance (e.g., $\Omega_e$) between the inverting input of the second input amplifier and the output of the second input amplifiers, and a third resistance (e.g., $\Omega_{m1}+\Omega_{m2}$) between the first resistor and the second resistor. Assuming the first and second resistors are substantially the same resistance ($\Omega_e$) the gain for each input amplifier is $$1 + \frac{\Omega_e + \Omega_e}{\Omega_{m1} + \Omega_{m2}}.$$

In certain examples, front-end circuit can include multiple resistor strings coupled in parallel between the outputs of the input amplifiers and intermediate nodes of each resistor string can be an input to a multiplexer of a selection circuit for completing the feedback circuit of each input amplifier according to a selection state of the multiplexer. In a second particular selection state, the selection circuit can directly couple the output of each input amplifier with the input of the corresponding input amplifier. Such an arrangement can provide unity gain for each of the input amplifiers. At 303, the front-end circuit can provide a representation of the input signal scaled by the selected gain. In certain examples, the front-end circuit can include a differential amplifier that receives the outputs of the input amplifiers and provides a fully differential signal representative of the input signal and scaled by the gain or attenuation of the first stage and the gain of the differential amplifier.

In certain examples, the simplicity of the multiple resistor strings as described above can simplify the front-end circuit compared to conventional front-end circuit designs while also providing high input impedance, improved linearity high common mode rejection, and trackable noise and distortion performance. In certain examples, integral non-linearity error (INL) can be on the order of +/−2.5 ppm, signal-to-noise ratio on the order of 98 dB and distortion performance can be on the order of −115 dB, gain error and offset error drift can be around +/−6 ppm/° C. over a temperature range of 0° C. to 70° C., and input signal frequency can be from DC to 100 kHz. In certain examples, the above performance characteristics can be achieved inexpensively with off-the-shelf components arranged as discussed above as opposed to using custom integrated circuits. In certain examples, a data acquisition signal chain using a front-end circuit according to the present subject matter can provide precise ratiometric stability and optimized noise and distortion performance for each gain setting.

Various Notes & Examples

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, the terms "including" and "comprising" are open-ended, that is, a system, device, article, composition, formulation, or process that includes elements in addition to those listed after such a term are still deemed to fall within the scope of subject matter discussed. Moreover, such as may appear in a claim, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of a claim. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. The following aspects are hereby incorporated into the Detailed Description as examples or embodiments, with each aspect standing on its own as a separate embodiment, and it is contemplated that such embodiments can be combined with each other in various combinations or permutations.

What is claimed is:

1. A front-end circuit for an analog-to-digital converter (ADC), the front-end circuit comprising:
    first and second JFET input amplifiers configured to receive an input signal; and
    a gain selection circuit coupled to the first JFET input amplifier and the second JFET input amplifier;
    the gain selection circuit comprising a plurality resistor strings, each resistor string including a plurality of resistors coupled in series, and wherein each string includes a first end node coupled to an output of the first JFET input amplifier and a second end node coupled to an output of the second JFET input amplifier; and
    a differential amplifier configured to receive an output of the first JFET input amplifier at a first differential input, to receive an output of the second JFET input amplifier at a second differential input, and to provide a differential output signal to the ADC, the differential amplifier including a pair of matched resistors to set a gain of the differential amplifier.

2. The front-end circuit of claim 1, wherein each resistor string is integrated within an integrated circuit separate from the first and second JFET amplifiers, and separate from other resistor string integrated circuits of the plurality of resistor strings.

3. The front-end circuit of claim 1, wherein the gain selection circuit includes a multiplexer, the multiplexer configured to couple a plurality of intermediate nodes of a selected resistor string.

4. The front-end circuit of claim 3, wherein the multiplexer is configured to selectively bypass the resistor strings.

5. The front-end circuit of claim 4, wherein the multiplexer is configured to bypass the resistor strings, and to couple the output of the first JFET input amplifier to an input of the first JFET input amplifier and coupling the output of the second JFET input amplifier to an input of the second JFET input amplifier.

6. The front-end circuit of claim 3, wherein the multiplexer is configured to couple a first intermediate node of the selected resistor string to a first input of the first JFET input amplifier;
wherein the first input of the first JFET input amplifier is an inverting input of the first JFET input amplifier; and
wherein the multiplexer is configured to couple a second intermediate node of the selected resistor string to a first input of the second JFET input amplifier.

7. The front-end circuit of claim 6, wherein the first input of the second JFET input amplifier is an inverting input of the second JFET input amplifier.

8. The front-end circuit of claim 6, wherein a second input of the first JFET input amplifier is configured to receive a first portion of the input signal.

9. The front-end circuit of claim 8, wherein a second input of the second JFET input amplifier is configured to receive a second portion of the input signal.

10. The front-end circuit of claim 1, wherein the representation of the input signal includes a signal-to-noise ratio (SNR) on the order of 98 dB, and gain error and offset error drift of about +/−6 ppm/° C. over a temperature range of 0° C. to 70° C.

11. The front-end circuit of claim 1, wherein the representation of the input signal includes total harmonic distortion on the order of −115 dB.

12. The front-end circuit of claim 1, wherein the representation of the input signal includes a common mode rejection ratio on the order of at least 90 dB.

13. The front-end circuit of claim 1, wherein the differential amplifier includes an active, anti-aliasing filter to remove out-of-band noise; and
wherein the active, anti-aliasing filter include passive components to remove the out-of-band noise at a bandwidth of interest.

14. The front-end circuit of claim 1, wherein the differential amplifier includes a over-ranging resistor coupled in parallel with a feedback resistor of the pair of matched resistors.

15. A method for providing a scaled representation of an input signal to an analog-to-digital converter, the method comprising:
receiving an input signal at a first JFET input amplifier and at a second JFET input amplifier; and
selecting a gain of each of the first and second JFET input amplifiers, wherein selecting the gain of each of the first and second JFET input amplifiers includes, in a first selection state, selectively coupling a first intermediate node of a resistor string of a plurality of resistor strings with a first input of the first JFET input amplifier, and selectively coupling a second intermediate node of the resistor string of the plurality of resistor strings with a first input of the second JFET input amplifier;
receiving an output of the first JFET input amplifier at a first differential input of a differential amplifier;
receiving an output of the second JFET input amplifier at a second differential input of the differential amplifier; and
providing a differential output signal to the analog-to-digital converter, wherein a matched set of resistors determine a gain of the differential amplifier;
wherein a first end node of the resistor string is coupled to an output of the first JFET input amplifier, and a second end node of the resistor string is coupled to an output of the second JFET input amplifier;
wherein each resistor string of the plurality of resistor strings includes a plurality of resistors coupled in series, and wherein each resistor string of the plurality of resistor strings includes a first end node coupled to an output of the first JFET input amplifier and a second end node coupled to an output of the second JFET input amplifier;
providing an output signal representative of the input signal scaled by the gain; and
wherein the plurality of resistor strings includes a plurality of individual integrated circuits, each individual integrated circuit of the plurality of individual integrated circuits including one resistor string of the plurality of resistor strings.

16. The method of claim 15, wherein selecting a gain of each of the first JFET input amplifier and the second JFET input amplifier includes:
in a second selection state, selectively coupling an output of the first JFET input amplifier directly with the first input of the first JFET input amplifier via a multiplexer, and selectively coupling an output of the second JFET input amplifier directly with the first input of the second JFET input amplifier via the multiplexer.

17. The method of claim 16, wherein the providing the output signal includes providing the output signal with an integral nonlinearity error (INL) of +/−2.5 parts per million (ppm) over a temperature range of 0° C. to 70° C.

18. An analog-to-digital converter (ADC) system comprising:
a front-end circuit configured to receive an input signal and to provide a scaled, differential representation of the input signal; and
an analog-to-digital converter (ADC) configured to receive the scaled, differential representation and to provide a digital representation of the input signal;
wherein the front-end circuit includes:
first and second input JFET amplifiers configured to receive an input signal;
a gain selection circuit coupled to the first JFET input amplifier and the second JFET input amplifier; and
a differential amplifier configured to receive an output of the first JFET input amplifier at a first differential input, to receive an output of the second JFET input amplifier at a second differential input, and to provide a differential output signal to the ADC as the scaled, differential representation of the input signal, the differential amplifier including a pair of matched resistors to set a gain of the differential amplifier;
wherein the gain selection circuit comprises a plurality resistor strings, each resistor string including a plurality of resistors coupled in series, and wherein each string includes a first end node coupled to an output of the first JFET input amplifier and a second end node coupled to an output of the second JFET input amplifier; and wherein the plurality of resistor strings includes a plurality of individual integrated circuits, each individual integrated circuit of the plurality of individual integrated circuits including one resistor string of the plurality of resistor strings.

19. The ADC system of claim 18, wherein the ADC includes a successive-approximation-register (SAR) or sigma-delta ADC with 18 or more bits of resolution.

20. The ADC system of claim 18, wherein each resistor string includes at least three individual resistors;

wherein the gain selection circuit includes a multiplexer, the multiplexer configured to couple a plurality of intermediate nodes of a selected resistor string;

wherein the multiplexer, in a first state, is configured to selectively couple respective intermediate nodes of a selected resistor string to a respective input of a respective one of the first JFET input amplifier and the second JFET input amplifier; and wherein the multiplexer, in a second state, is configured to selectively bypass the resistor strings.

* * * * *